United States Patent
Curran et al.

(10) Patent No.: US 10,208,393 B2
(45) Date of Patent: Feb. 19, 2019

(54) HIGH THERMAL CONDUCTIVITY INSULATED METAL SUBSTRATES PRODUCED BY PLASMA ELECTROLYTIC OXIDATION

(71) Applicant: Keronite International Limited, Haverhill (GB)

(72) Inventors: James Andrew Curran, Haverhill (GB); Stephen Hutchins, Haverhill (GB)

(73) Assignee: Keronite International Limited, Haverhill, Suffolk (GB)

( * ) Notice: Subject to any disclaimer, the term of this patent is extended or adjusted under 35 U.S.C. 154(b) by 249 days.

(21) Appl. No.: 14/905,256

(22) PCT Filed: Jul. 16, 2014

(86) PCT No.: PCT/GB2014/052171
§ 371 (c)(1),
(2) Date: Jan. 14, 2016

(87) PCT Pub. No.: WO2015/008064
PCT Pub. Date: Jan. 22, 2015

(65) Prior Publication Data
US 2016/0153111 A1    Jun. 2, 2016

(30) Foreign Application Priority Data

Jul. 16, 2013  (GB) .................................. 1312708.9

(51) Int. Cl.
*C25D 11/02* (2006.01)
*C25D 11/04* (2006.01)
(Continued)

(52) U.S. Cl.
CPC .......... *C25D 11/026* (2013.01); *C25D 11/024* (2013.01); *C25D 11/04* (2013.01);
(Continued)

(58) Field of Classification Search
CPC .................................................... C25D 11/026
(Continued)

(56) References Cited

U.S. PATENT DOCUMENTS

| 6,468,410 | B1* | 10/2002 | Donne | ................... | C25D 17/00 |
| | | | | | 204/267 |
| 2005/0223551 | A1 | 10/2005 | He | | |
| 2010/0320079 | A1* | 12/2010 | Nosti | ..................... | C25D 21/12 |
| | | | | | 204/230.1 |

FOREIGN PATENT DOCUMENTS

| EP | 2077343 A1 | 7/2009 |
| EP | 2246304 A1 | 11/2010 |

(Continued)

OTHER PUBLICATIONS

Dunleavy et al; "Time dependent statistics of plasma discharge parameters during bulk AC plasma electrolytic oxidation of aluminum" Applied Surface Science, 268, 2013, p. 397-409. (Year: 2013).*

(Continued)

*Primary Examiner* — Brian W Cohen
(74) *Attorney, Agent, or Firm* — Shumaker & Sieffert, P.A.

(57) ABSTRACT

There is disclosed an insulated metal substrate, consisting of a dielectric oxide coatings of high crystallinity (>vol 90%) on aluminium, magnesium or titanium and high thermal conductivity (over 6 $Wm^{-1}K^{-1}$), formed by plasma electrolytic oxidation on a surface comprising aluminium, magnesium or titanium. There is also disclosed a plasma electrolytic oxidation process for generating dielectric oxide coatings of controlled crystallinity on a surface of a metallic workpiece, wherein at least a series of positive pulses of current are applied to the workpiece in an electrolyte so as to generate plasma discharges, wherein discharge currents are restricted to levels no more than 50 mA, discharge (Continued)

durations are restricted to durations of no more than 100 μs and are shorter than the durations of each the positive pulses, and/or by restricting the power of individual plasma discharges to under 15W. There is also disclosed an insulated metal substrate capable of withstanding exposure to high temperatures (over 300° C.) and thermal shock or repeated thermal cycling of over 300° C., as a result of excellent adhesion of the insulating dielectric to the metal substrate, and the mechanically compliant nature of the coating (E~20-30 GPa). Furthermore, there is disclosed a method of making these insulated metal substrates so thin as to be mechanically flexible or pliable without detriment to their electrical insulation.

5 Claims, 10 Drawing Sheets (51) Int. Cl.
    C25D 11/26      (2006.01)
    C25D 11/30      (2006.01)
    C25D 21/12      (2006.01)
    C30B 7/12       (2006.01)
    C30B 7/14       (2006.01)
    C30B 29/16      (2006.01)
    C30B 29/20      (2006.01)
    C30B 30/02      (2006.01)
    H05K 7/20       (2006.01)
    G01R 19/00      (2006.01)

(52) U.S. Cl.
    CPC .............. *C25D 11/26* (2013.01); *C25D 11/30* (2013.01); *C25D 21/12* (2013.01); *C30B 7/12* (2013.01); *C30B 7/14* (2013.01); *C30B 29/16* (2013.01); *C30B 29/20* (2013.01); *C30B 30/02* (2013.01); *H05K 7/2039* (2013.01); *G01R 19/0061* (2013.01)

(58) Field of Classification Search
    USPC ........ 204/229.8, 229.9; 205/81–83, 135–136
    See application file for complete search history.

(56) References Cited

FOREIGN PATENT DOCUMENTS

| JP | 2009197278 | | 9/2009 |
|---|---|---|---|
| WO | 2007091976 | A1 | 8/2007 |
| WO | 2008120046 | A1 | 10/2008 |

OTHER PUBLICATIONS

International Search Report and Written Opinion for corresponding PCT Application No. PCT/GB2014/052171, dated Feb. 3, 2015 (16 pgs.).

Search Report under Section 17(5) for corresponding GB Application No. 1312708.9, dated Nov. 22, 2013 (4 pgs.).

Search Report under Section 17(6) for corresponding GB Application No. 1312708.9, dated Jul. 1, 2015 (2 pgs.).

Dunleavy et al., "Characterisation of discharge events during plasma electrolytic oxidation," Surface and Coatings Technology, Elsevier, Amsterdam, NL, vol. 203, No. 22, Aug. 15, 2009 (pp. 3410-3419.).

Yerokhin et al., "Discharge characterization in plasma electrolytic oxidation of aluminium," Journal of Physics D: Applied Physics, Sep. 7, 2003 (pp. 2110-2120.).

* cited by examiner

Electrolytic cell

HIGH THERMAL CONDUCTIVITY INSULATED METAL SUBSTRATES PRODUCED BY PLASMA ELECTROLYTIC OXIDATION

This application is a national stage application under 35 U.S.C. § 371 of PCT Application No. PCT/GB2014/052171, filed Jul. 16, 2014, which claims the benefit of Great Britain Application No. 1312708.9, filed Jul. 16, 2013. The entire contents of each of PCT Application No. PCT/GB2014/052171 and Great Britain Application No. 1312708.9 are incorporated herein by reference in their entirety.

This invention relates to high thermal conductivity insulated metal substrates produced by plasma electrolytic oxidation (PEO) processes. The substrates comprise a high crystallinity, high thermal conductivity dielectric oxide coating formed on a surface of aluminium, magnesium, titanium or other valve metals. The substrates can be used for mounting high power electronic components and help improve the efficiency of heat transfer due to their high thermal conductivity. Electrically conductive interconnection tracks and attachment pads for electronic devices, including power electronic devices, may be formed on the substrate. Furthermore, the substrates may be sufficiently thin to be mechanically flexible or pliable.

BACKGROUND

It is a common requirement in electronic power substrates to be able to attach devices and be able to dissipate heat developed by the devices in an efficient way. There is a need to optimise the size of the substrate and the electrical/thermal performance of the devices and circuit in varied ambient conditions, where the thermal resistance, balanced against electrical isolation, between the device and the substrate, is higher than desired for optimum performance.

The competing requirements of high dielectric strength (i.e. good electrical insulation), with high thermal conductivity, is satisfied by very few materials. The most suitable materials include diamond, aluminium nitride, and other engineering ceramics, but these are of limited practical opportunity. In practice, a severe compromise is usually made on either the dielectric strength, or on the thermal conductivity. Polymer insulation, for instance, is often used in such applications, but is limited to thermal conductivities of $\sim 1$ $Wm^{-1}K^{-1}$, and is of course limited to low temperature applications (typically <200° C.).

Conventional anodising (for instance, as disclosed in GB2162694, U.S. Pat. Nos. 4,015,987, 5,687,062) offers reasonable dielectric strength of a couple of hundred volts, but the amorphous oxides formed by conventional anodising offer low thermal conductivity (<1 $Wm^{-1}K^{-1}$), and suffer from defects on sharp convex radiuses. The defects are partially overcome in WO96/33863, but remain a problem. Furthermore, anodised coatings tend to dehydrate and crack above 100° C. making them unsuitable for high temperature applications. Moreover, on titanium and magnesium, the oxides achieved by anodising are very thin and insubstantial.

Plasma electrolytic oxidation (PEO), also known as micro-arc oxidation (MAO), is an enhancement of anodising which overcomes some of these defects. Like anodising, it may be applied to any valve metals (i.e. metals whose oxides present electrically rectifying behaviour), but it is in fact less sensitive to the exact composition of the substrate alloy and can be successfully applied to any common alloys of Al, Mg or Ti.

The resulting oxides do not suffer from the columnar porosity inherent in anodised aluminium, and the consequent defects on sharp convex radiuses and complex geometries. Even on Mg and Ti alloys, thicknesses of several microns of uniform oxide coatings can be achieved. The oxides are well adhered, hard, and physically robust. For instance, their low elastic moduli of just a couple of tens of GPa ["Thermo-physical properties of plasma electrolytic oxide coatings on aluminium", Curran, J. A. and Clyne, T. W., Surface and Coatings Technology, v.199(2-3), pp.168-176 (2005)] make them strain tolerant, and able to resist thermal cycles of over 500° C. without any damage or chemico-physical change to the coating. They have fine scale porosity (from a few hundred nanometers in diameter down to the limit of detection of most analysis techniques at a few nm).

The oxides tend to be at least partially crystalline, and this has resulted in standard PEO coatings having reported thermal conductivities of $\sim 2$ Wm−1K−1 on aluminium and magnesium ["The thermal conductivity of plasma electrolytic oxide coatings on aluminium and magnesium", Curran, J. A. and Clyne, T. W., Surface and Coatings Technology, v.199(2-3), pp.177-183 (2005)]. This is higher than the values for the amorphous coatings which result from conventional anodising, but remains an order of magnitude lower than expected values for polycrystalline alumina or magnesia ($\sim$20-40 $Wm^{-1}K^{-1}$), and is a consequence of the fine grain size (generally measured at tens to hundreds of nanometers) ["The thermal conductivity of plasma electrolytic oxide coatings on aluminium and magnesium", Curran, J. A. and Clyne, T. W., Surface and Coatings Technology, v.199(2-3), pp.177-183 (2005)] and the significant amorphous phase proportion in the coating. There has been some interest in reducing the thermal conductivities further still, to offer better thermal insulation, and this has been achieved by additions to the electrolyte ["Mullite-rich plasma electrolytic oxide coatings for thermal barrier applications", Curran, J. A., Kalkanci, H., Magurova, Yu., and Clyne, T. W., Surface & Coatings Technology, v.201, pp. 8683-8687 (2007)].

The application of PEO in power electronics has been described in general terms in WO2006/075176, and the present invention builds on the work outlined in that disclosure. In WO2006/075176, the dielectric strength (breakdown strengths of up to 3.5 kV for coatings of 20-30 μm thickness), and the physical robustness of the coatings, are recognised as being superior to that of anodising. The scope for directly applying electrical circuitry (by such means as electroless copper deposition, thick film deposition, sputtering etc.) to minimise thermally resistive interfaces, is also recognised. These means are favoured by the surface roughness and fine scale porosity which is inherent to PEO coatings.

The state of the art of PEO until now, however, has been limited to upper values of 2-3 $Wm^{-1}K^{-1}$ in thermal conductivity, and although this has been sufficient for many applications such as high power LED substrates, this has ultimately limited the potential applications and usefulness of this technology as a basis for insulated metal substrates.

Hitherto, insulated metal substrates generally have an upper operating temperature limit of 200-250° C., due to their reliance on polymeric layers for electrical insulation, or due to mismatch between the mechanical properties of the metal substrates and the insulating layers which makes them vulnerable to delamination and coating spallation under the stresses generated by temperature changes. This also severely limits their resistance to thermal shock and thermal cycling.

Known flexible substrates rely on polymer films such as kapton, with low thermal conductivity (~0.2-0.35 $Wm^{-1}K^{-1}$ at room temperature), giving low performance in terms of heat extraction.

BRIEF SUMMARY OF THE DISCLOSURE

Viewed from a first aspect, there is provided an insulated metal substrate, consisting of a dielectric oxide coating of high crystallinity (>90 vol %) and high thermal conductivity (over 6 $Wm^{-1}K^{-1}$), formed by plasma electrolytic oxidation on a surface comprising aluminium, magnesium or titanium or alloys comprising aluminium, magnesium and/or titanium.

Viewed from a second aspect, there is provided an insulated metal substrate provided with a compliant ceramic insulating layer or layers that adheres to the metal substrate and is able to withstand exposure to temperatures of over 300° C., and thermal cycles of 300° C. or more. In this aspect, thermally unstable insulating materials such as polymers are avoided. In some embodiments, the insulated metal substrate is able to withstand exposure to temperatures of over 500° C., and optionally thermal cycles of 500° C. or more. In certain embodiments, the insulating metal substrate is able to withstand exposure to temperatures as high as the respective melting temperature of the metal used for the substrate. In the case of titanium, temperatures of over 800° C. can be accommodated, making the substrate suitable for use with thick-film pastes with high firing temperatures.

Viewed from a third aspect, there is provided a flexible or pliable insulated metal substrate, formed by surface oxidation of a thin metal substrate or substrates of thickness less than 500 μm. The substrate(s) may be thin foils, tapes or wires, depending on the desired geometry. The preferred method of surface oxidation is plasma electrolytic oxidation, because of its adhesion and compliance, which minimises strain-related stresses.

Viewed from a fourth aspect, there is provided a plasma electrolytic oxidation process for generating dielectric oxide coatings of controlled crystallinity on a surface of a metallic workpiece, wherein at least a series of positive pulses of current are applied to the workpiece in an electrolyte so as to generate plasma discharges, wherein discharge currents are restricted to levels no more than 50 mA, discharge durations are restricted to durations of no more than 100 μs and are shorter than the durations of each the positive pulses, and/or by restricting the power of individual plasma discharges to under 15W.

The plasma electrolytic oxidation process is undertaken in an aqueous electrolyte, which typically consists of a dilute alkaline or acid solution providing a source of $OH^-$ ions. Examples of such electrolytes are found, for example, in WO99/31303.

Additional materials may be added to the aqueous electrolyte and subsequently incorporated into the coating to further control its composition and microstructure.

The current-time profile of the plasma discharges may be controlled by the precise adjustment of the applied voltage in accordance with deterministic relations measured in separate tests on reduced areas.

The duration (and hence charge transfer and power) of the plasma discharges may be controlled by precise adjustment of the pulse duration in accordance with deterministic relations measured in separate tests on reduced areas.

In some embodiments, control of the plasma discharges enables control of plasma temperatures (as defined by $OH^-$ molecular ion rotational or vibrational emission spectra), and thus of the resulting coating microstructure.

In some embodiments, the surface of a metal comprising magnesium is converted into an oxide comprising a majority of the periclase crystalline phase of MgO.

Alternatively, the surface of a metal comprising titanium is converted into an oxide comprising a majority of the rutile or anatase crystalline phases of $TiO_2$.

Viewed from a fifth aspect, there is provided a method of monitoring electrical characteristics of individual discharges within a plasma electrolytic oxidation process undertaken on a metallic workpiece by exposing at least one small area (preferably <0.5 $mm^2$) of the workpiece or of a test piece made of the same material as the workpiece to electrolyte under various voltages within a range of interest, such that individual discharges are separately resolvable in a monitored flow of current to the small area.

This is in contrast to conventional plasma electrolytic processing of a larger area, where discharges tend to overlap and are not individually resolvable.

The electrical characteristics that are monitored preferably include the dependence of the current-time profiles of the discharges on the applied voltage.

The small area may consist of a wire, exposed to the electrolyte in parallel with the larger area of a workpiece component, but electrically isolated from that larger component in such a way that the current flow between the two may be monitored.

The isolated wire may be embedded within the surface of the larger workpiece component.

Viewed from a sixth aspect, there is provided a plasma electrolytic oxidation process in which the formation of corundum is promoted by the use of workpieces comprising both aluminium and copper, with the copper acting to promote formation of the corundum phase when present at levels of over 2% in coatings which would otherwise consist of pure gamma-alumina.

Coatings formed by the processes described above may be used as insulated metal substrates for efficient heat distribution. Typically, they might be used for the efficient extraction of the heat generated by electrical circuitry, electronic, or micro-electronic components, so as to avoid over-heating and/or to promote the efficiency of such devices. They might also be used for more electrically efficient heating systems, based on resistance heating, or for more efficient thermoelectric devices based on the Peltier-Seebeck and related effects. They might simply be used for improved thermal efficiency in devices such as heat exchangers, wherever a level of electric insulation or even simply surface protection (from galvanic corrosion or wear) might be needed.

In embodiments of the present invention, the thermal conductivities of the plasma electrolytic oxide coatings are substantially increased by using improved control over plasma discharges to promote the formation of optimal crystalline phases to over 90 vol % on aluminium, titanium or magnesium). This results in thermal conductivities of over 6 $Wm^{-1}K^{-1}$ in all cases, which is far in excess of any of those previously reported in the literature.

The control method, set out in the present disclosure, is itself of interest, and has wider application within the technology of plasma electrolytic oxidation where, to date, technical developments have been largely empirical. Greater control over coating composition and microstructure has implications for every area of PEO coating application. For instance, harder coatings can offer greater wear resistance, more phase-pure coatings may have greater potential for catalytic applications, and denser coatings can offer improved corrosion protection. The process control also allows more energy efficient process regimes to be selected.

The control is achieved in the key domain of plasma discharges, hitherto an uncontrolled, stochastic element of all PEO systems, with even such simple properties as discharge duration (and consequently energy) ranging over two to three orders of magnitude for any given system, and with no control whatsoever over plasma temperature. In some embodiments of the present invention, control over discharge duration is established to within microseconds, and plasma temperature is controlled for the first time, with the result that coating structure can be optimised for high crystallinity and high thermal conductivity as well as mechanical properties such as flexibility.

WO2012/107755 discloses an alternative electrolytic process for achieving enhanced thermal conductivity of aluminium oxide on aluminium substrates. This process is stated to work without the discharges that are intrinsic to PEO and to the present invention. With reference to WO2006075176, WO2012/107755 suggests that discharges are in fact detrimental and need to be eliminated (or at least "minimised"). Instead, the origin of crystalline material in WO2012/107755 appears to be a colloidal suspension of crystalline solids in the electrolyte. It attributes an allegedly improved thermal conductivity to reduced grain sizes relative to PEO whereas the present invention embraces the thermally conductive crystal grains that are intrinsic to PEO, and instead boosts thermal conductivity by enhancing the degree of crystallinity of the coatings. Ideally, recrystallisation and even grain growth are promoted by the discharge control used in the present invention, but this does not appear to be a necessary aspect. High thermal conductivities can be achieved as a result of augmented crystallinity, while the grain size distributions remain consistent with literature values for PEO coatings ["The thermal conductivity of plasma electrolytic oxide coatings on aluminium and magnesium", Curran, J. A. and Clyne, T. W., Surface and Coatings Technology, v. 199(2-3), pp. 177-183 (2005)]. A further claim of WO2012/107755 is that enhanced thermal conductivity is achieved by reducing pore sizes relative to PEO coatings. The present invention does not rely on any such reduction of pore sizes: the pore sizes of the PEO coatings formed by the present invention remain consistent with literature values for typical PEO coatings ["Porosity in plasma electrolytic oxide coatings", Curran, J. A. and Clyne, T. W., Acta Materialia, v. 54, pp. 1985-1993 (2006)].

Embodiments of the present invention enable the formation of high thermal conductivity insulated metal substrates by the plasma electrolytic oxidation of aluminium, magnesium or titanium alloys. By establishing the deterministic relations between discharge initiation voltage and plasma discharge parameters such as charge and energy transfer, the voltage and duration of pulses may be tailored to optimise plasma discharge power and temperature, to control the resulting energy input into the coating, and consequently its phase composition.

The resulting oxides may be over 92%, 93% and 90% crystalline in the $Al_2O_3$ alumina, MgO periclase and $TiO_2$ rutile forms which are respectively formed on substrates comprising Al, Mg and Ti (with the crystalline alumina itself being over 80% of the $\alpha$-$Al_2O_3$ "corundum" form). These coatings have thermal conductivities of at least 10, 6 and 8 $Wm^{-1}K^{-1}$, on those respective substrates. This makes them suitable for heat transfer applications, whether in heat extraction from power electronics, distribution of heat from resistance heaters, or thermoelectric devices. The process can be applied to components of complex geometries, without suffering from edge or corner defects in its dielectric insulation. The insulated metal substrates may be exposed to high temperatures, or experience thermal cycles or shock of over 500° C., without suffering mechanical damage and reduced performance. This is due to the excellent adhesion of the oxides to the metal substrates, together with the mechanical compliance of the insulating oxides, with an elastic modulus of just ~20-30 GPa minimising the stresses that result from a given thermally induced strain. Because of the compliance of the oxide layers, the insulated metal substrates may also be flexible and pliable when formed on thin metal substrates (such as foils or wires with thicknesses of less than 500 μm).

BRIEF DESCRIPTION OF THE DRAWINGS

Embodiments of the invention are further described hereinafter with reference to the accompanying drawings, in which.

DETAILED DESCRIPTION

The present disclosure relates to an enhancement of the technology described in WO2006/075176, namely the use of plasma electrolytic oxide (PEO) coatings (also known as micro-arc oxide coatings or anodic spark deposition coatings) as an electrically insulating, thermally conductive surface treatment for the metallic substrates used for thermal management of electrical circuits.

In the present disclosure, greatly improved thermal conductivities of the PEO coatings are achieved on any valve metal such as aluminium, magnesium, or titanium, by improving control over the plasma discharges, and thus generating oxide layers with a higher phase proportion of e.g. corundum, periclase and rutile, respectively. These materials have nominal single crystal thermal conductivities of up to around 40 $Wm^{-1}K^{-1}$, 30 $Wm^{-1}K^{-1}$ and 9 to 13 $Wm^{-1}K^{-1}$ respectively, and while the nominal single crystal values of the alumina and magnesia have not yet been attained experimentally in PEO coatings, enhanced crystallinity has delivered improvements of a factor of four to five in the observed thermal conductivities of the PEO coatings, by way of the processes disclosed herein.

Tantalum, zirconium, beryllium and other valve metals (i.e. metals whose oxides present rectifying behaviour in electrolytic cells) may also be treated using this process, and have been shown to produce good dielectrics such as tantalum pentoxide, zirconia and beryllia respectively. The present processes, applied to those metals, will also increase the crystallinity of the PEO coating, and improve thermal conductivity and other properties. While these other metals have some potential for use in niche applications, they do not necessarily present the same combination of attractive thermal and electrical properties seen in the aluminium, magnesium and titanium examples which constitute the main practical application of this technology, and are not therefore discussed in further detail.

The preferred embodiment of the hardware for the PEO process for the present invention is the Keronite® PEO process—as described in WO03/083181, the content of which is hereby incorporated into the present application by reference, although the control method disclosed herein may be applied to any PEO process.

In a preferred embodiment, the metallic substrate is immersed in a continuously agitated, re-circulated, cooled electrolyte, and an electrical connection is made to one output terminal of the power supply, with an inert (e.g. 316 stainless steel) counter electrode typically connected to the other output terminal.

A wide variety of electrolyte compositions may be used, typically including a source of $OH^-$ ions such as NaOH or KOH or $NH_4OH$ in low concentrations (<3 g per l). Dilute acids may also be used. The primary purpose of the additions, whether alkaline or acidic, is to increase the conductivity of the electrolyte to at least 1 $mScm^{-1}$. The $OH^-$ ions serve as a source of oxygen for the oxidation of the substrate metals. Other compounds which fulfil these purposes include phosphates such as sodium or potassium phosphate. Other compounds may be added to the electrolytes to enhance coating deposition rates, to control microstructure and composition, and to assist in the dissolution of the substrates and native oxides.

A power supply, sufficient to deliver a current density of at least 10 A per $dm^2$ of exposed substrate area, at voltages of over 250V (preferably up to 1000V) is used to deliver pulses of positive potential to the workpiece. Typically, banks of capacitors are used to store the power, and rapid switching equipment is used to apply the pulsed potential by alternatively switching between the outputs of one or more rectifiers with well-controlled output voltages. Such a system offers approximately square-waved pulses. Elements such as inductors may be introduced to give a further degree of control over pulse ramp rates, giving trapezoidal waveforms. In preferred embodiments, this switching is sufficiently rapid that voltages of over 425V (preferably up to 1000V) can be stably reached within less than 5 microseconds.

Negative pulses may be used in addition to the positive pulses, and are generally thought to contribute to the uniformity and efficiency of coating growth. It is also thought likely that they contribute to the promotion of stable crystalline phases through joule heating. While negative pulses may be used, it is the positive, anodic pulses which constitute the main focus of the process improvement in the present application.

The positive and negative potentials may be held constant, or may be independently varied in a controlled way during processing. Examples of controlled variations include adjustment to maintain a constant average current density.

Figure 1:
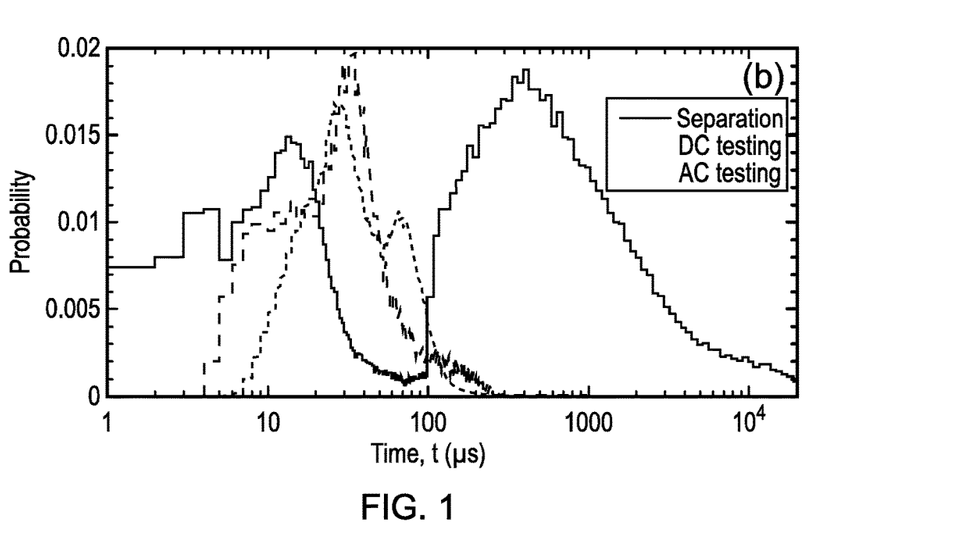
FIG. 1 shows an example of the typical distribution of discharge durations during PEO processing (either by DC or AC testing), together with typical discharge separations.

The anodic potentials result in highly stochastic localised dielectric breakdown of anodically formed oxide layers on the workpiece surface. The resulting discharges, and the associated short-lived microscopic plasmas, are the defining characteristic of plasma electrolytic oxidation. They provide an intense local injection of energy which is sufficient to cause localised melting of the oxide, which crystallises as it rapidly cools and resolidifies. Clearly, as with any heat treatment for a material of a given composition, the temperature-time profile will strongly determine the resulting microstructure, phase proportion, and properties. Crystallinity, in particular, will be determined by the intensity of power injection to the oxide, the temperature attained, and the cooling rate. FIG. 1 represents typical durations on aluminium, showing typical plasma discharge duration histograms from prior art bulk PEO processing of 6082 aluminium in a KOH-based electrolyte, and reveals an uncontrolled, near Gaussian distribution.

In hitherto known PEO processing systems, however, there is no control over the characteristics of the electrical discharges or of the resulting plasma. Parameters such as the discharge duration, the currents attained, the charge transfer and power are all distributed over two or more orders of magnitude. Moreover, no control over the plasma temperature has, to the knowledge of the present Applicant, been demonstrated prior to this application. Consequently, there has been little scope for optimising the energy input from the plasma into the growing coatings for high degrees of crystallinity.

In embodiments of the present invention, an improved degree of control over the plasma discharges is achieved, to the extent of controlling the plasma temperature. The crystallinity of the $Al_2O_3$, MgO or TiO which are formed on aluminium, magnesium and titanium respectively, may thus be increased to yield higher thermal conductivity.

Figure 2:
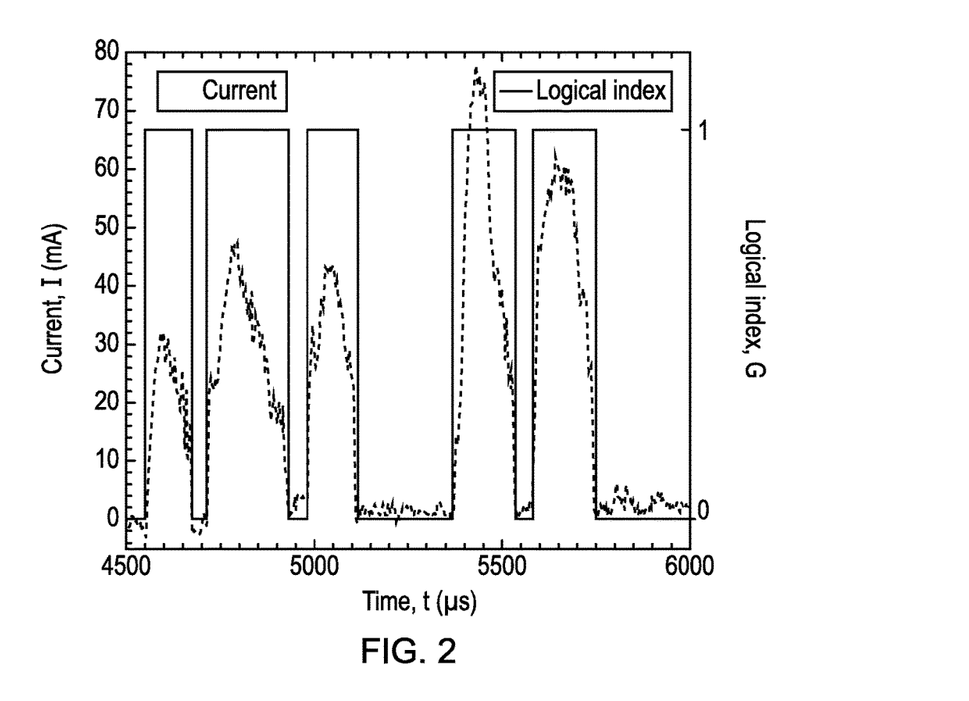
FIG. 2 shows an example of data from measurements on a small area, in which individual electrical discharges can be resolved (as indexed by the logical index G), and from which discharge parameters such as peak current, duration, and energy (from integrated areas) may be determined.

Precise and statistically significant knowledge of the deterministic relations is an important aspect of some embodiments. One technique for measuring these deterministic relations is to survey thousands (ideally millions) of individual discharges in an identical PEO system (identical in terms of substrate alloy and electrolyte and applied potential), by means of current and voltage monitoring on a small area, such that few, or no discharges occur simultaneously, and the electrical parameters (such as peak current, duration, rise time, charge transfer) of the individual discharges may be isolated and analysed. FIG. 2 shows data from small area testing, such that individual electrical discharges can be resolved and parameters such as peak current, duration, rise-time to peak current, charge transfer and power, may be quantified. This may be achieved by testing in a small well of electrolyte, applied to an existing PEO surface, or by connecting a number of wires (e.g. of 500 μm diameter) in electrical series with a bulk sample, and exposing their small cross sectional areas to the electrolyte so as to form a parallel branch of the overall electrolytic cell (FIG. 5), whilst the current to the small area ($I_2$) is separately monitored. If the specific local conditions of a specific region of the surface are to be considered, these small wires may be set into a threaded piece of electrical insulation (such as epoxy resin) and inserted into a threaded hole in the surface of a large component (as shown in FIG. 4) so as to obtain data representative of specific regions of the surface of a component and of specific local electrolyte conditions.

Figure 3:
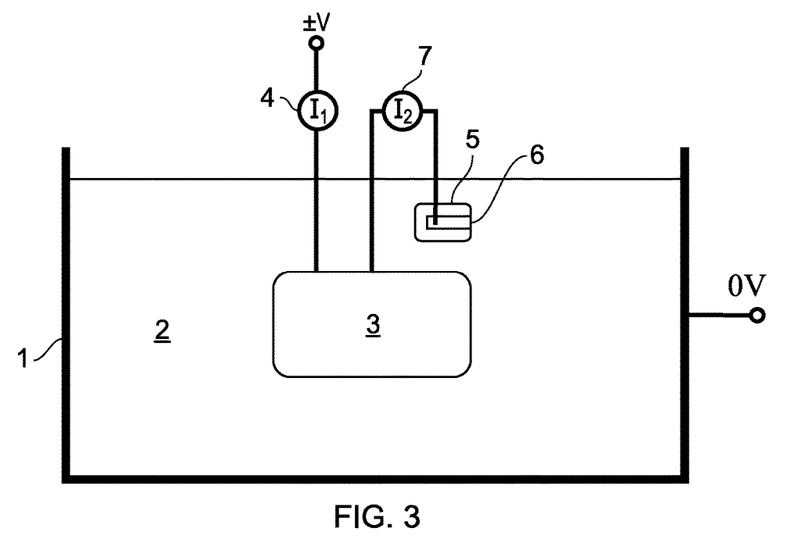
FIG. 3 shows an experimental arrangement which allows measurement of the electrical parameters of individual discharges by processing a small area (composed of one or more small diameter wires) in parallel with a bulk specimen. The arrangement enables separate monitoring of the overall current in the system ($I_1$) and the current ($I_2$) flowing to a relatively small exposed area.

FIG. 3 shows a plasma electrolytic oxidation system comprising a bath 1 containing aqueous electrolyte 2. A metallic workpiece 3 is held in the electrolyte 2 and connected by an electrode connection 4 to a terminal of a current source (not shown). This electrical connection, like all the other electrical connections indicated by thick lines in the Figure, is to be made using a conductor with electrically insulating shielding, such that it is protected from the electrolytic cell. The overall current ($I_1$) may be monitored on this connection 4. If the bath 1 is also made of metal, for example stainless steel, it may be configured as an electrode of opposite polarity to the workpiece 3 by connecting the bath to an opposite terminal of the current source. Alternatively, a separate electrode (not shown) of opposite polarity to the workpiece 3 may be held in the electrolyte 2 so as not to touch the workpiece 3. A separate element, 5 consisting of electrically insulating polymer surrounding a smaller test component 6, such as a wire made of the same material as the workpiece 3, is presented to the electrolyte in the same manner as the workpiece 3. A further electrical connection 7 is made between the workpiece 3 and the core 6 of the second element 5. The current ($I_2$) to the smaller test area 6 may thus be separately monitored, and if the area of the smaller test component 6 is sufficiently small, the electrical discharges associated with the PEO process will be separately resolvable in this current data.

Figure 4:
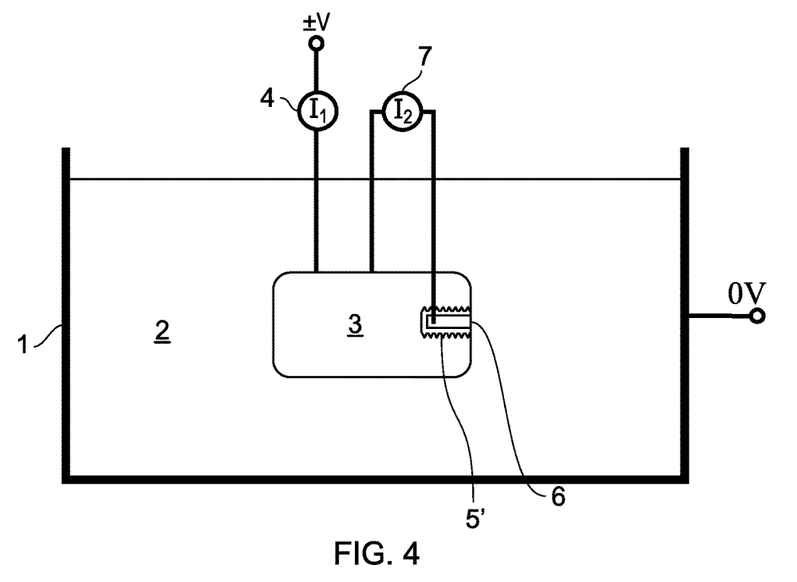
FIG. 4 shows an alternative arrangement in schematic form, the arrangement enabling separate monitoring of the overall current in the system ($I_1$) and the current ($I_2$) flowing to a relatively small area.

FIG. 4 shows an alternative arrangement to that of FIG. 3, with like parts being labelled as for FIG. 3. In the FIG. 4 arrangement, the small test area or component 6 is contained within a threaded, electrically insulative insert 5' that has been screwed into a threaded hole in the main workpiece 3 so as to be exposed at its end to the specific local conditions of part of the surface of the main workpiece 3.

Figure 5:
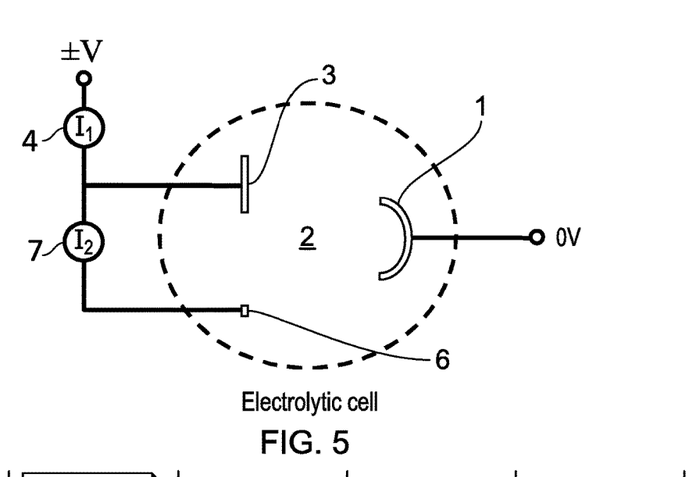
FIG. 5 shows an equivalent electrical circuit for the arrangements of FIGS. 3 and 4, with an electrolytic cell consisting of the large and small specimen areas as active electrodes, arranged in parallel relative to a counter electrode (shown to be at 0V in this case) enabling current monitoring of the overall current ($I_1$) and the small area current ($I_2$).

As shown in the equivalent electrical circuit in FIG. 5, the arrangements of FIGS. 3 and 4 place the small area 6 in parallel with the bulk sample surface of the workpiece 3, as far as the electrical cell of the PEO system is concerned. In practice, the small area 6 can be embedded within the surface of the workpiece 3 as shown in FIG. 4, so as to best replicate local electrolyte conditions. This may be achieved by embedding the wire 6 in a piece of threaded electrically insulative material 5' (such as epoxy resin), and screwing this into a threaded hole in the surface of the workpiece. An electrical connection 7, into the wire 6, must then be made via a separate hole in the workpiece (not shown) and through the insulative material 5, so as to complete the parallel branch of the electrolytic cell, and to enable monitoring of the current to the smaller area. Current monitoring may be achieved by using a differential current probe, or by measuring the voltage across a suitable resistor.

The process relations thus established give deterministic relationships between applied voltage and all the resulting parameters of the electrical discharges: the current-time profile, the peak current achieved, the rise time, the charge transferred, and hence the energy and power.

Figure 6:
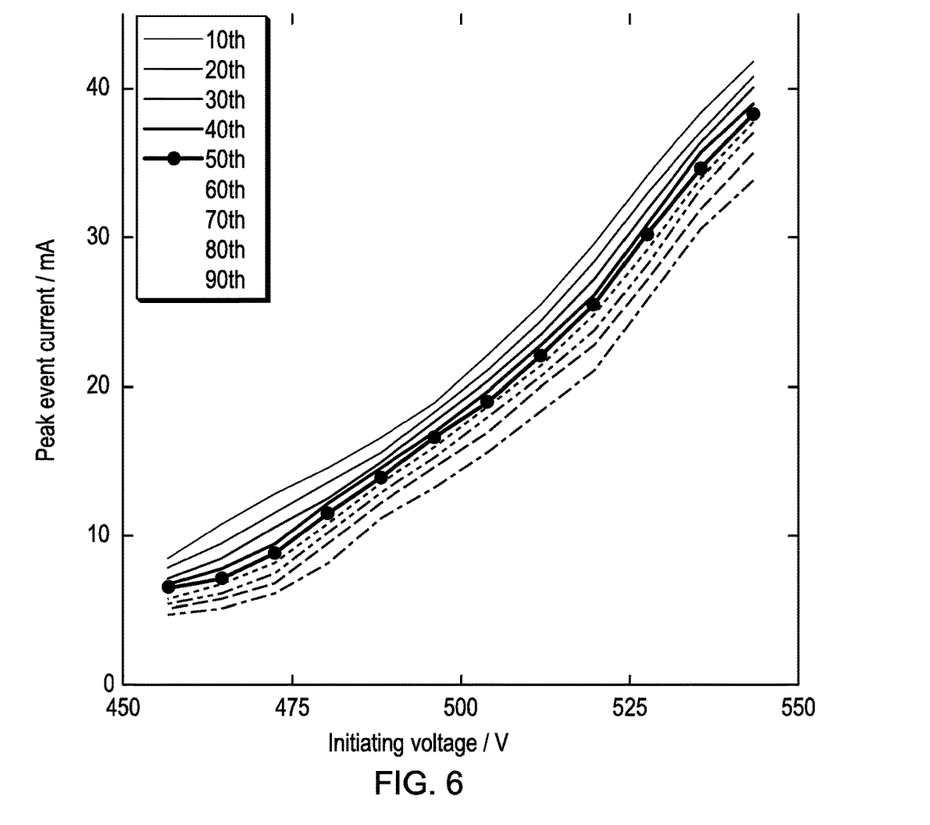
FIG. 6 shows an example of the deterministic relation between the peak current in individual discharges (expresses as percentiles of the population distribution) and the overall applied process voltage at which these discharges initiated.
Figure 7:
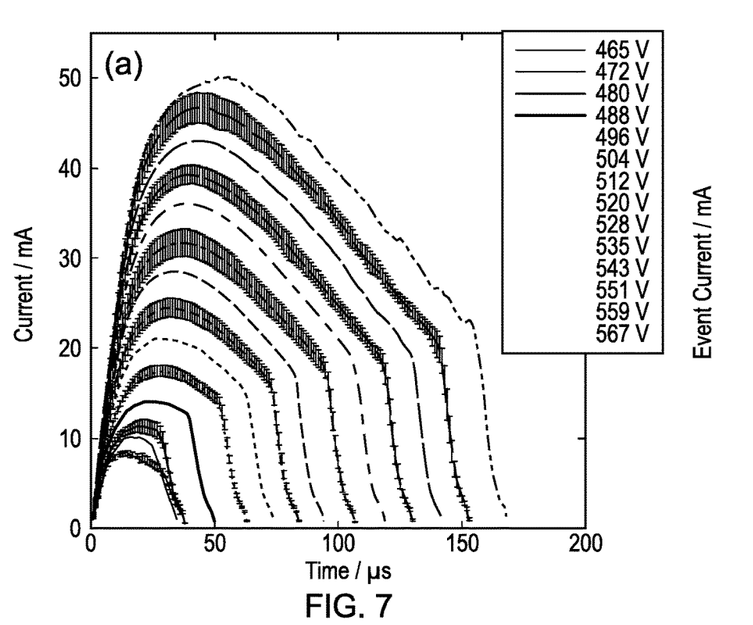
FIG. 7 shows an example of the self-similar scaling of discharges, whereby the applied voltage (see Figure legend) determines most of the key parameters of the individual discharges, such as peak current, duration, and charge and energy transfer.

For example, the peak current will be precisely determined by the voltage, as shown in FIG. 6, which illustrates an example of the deterministic relations between applied voltage and the peak current of plasma discharges. Indeed, due to the self-similar scaling of discharges as shown in FIG. 7, which illustrates the deterministic relations between applied voltage and the development of discharges, including charge transfer (from integrated areas), energy and power, similar deterministic relations exist between the voltage and most of the key parameters of the discharge, such as the rise time to peak intensity, the peak current, the duration, the charge transferred (from the integrated area under the current-time profiles), and hence the energy and power transferred. All such relations still exhibit a certain level of statistical variance, but rather than varying by orders of magnitude, discharge parameters can now be controlled to within a few mA with a two-sigma level of confidence (note for example, the percentiles for peak current as a function of initiation voltage in FIG. 6).

Figure 9:
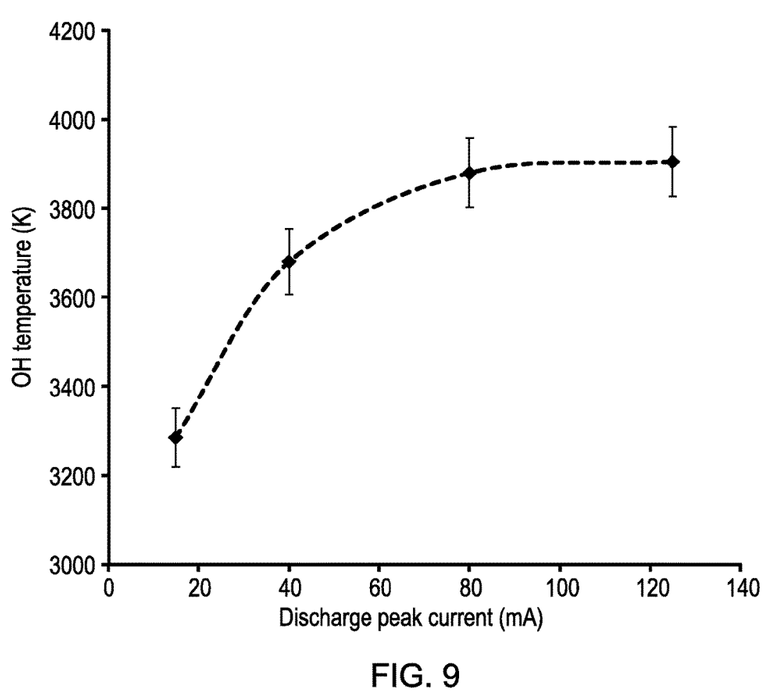
FIG. 9 shows an example of the dependence of plasma temperature (as measured by $OH^-$ molecular ion emissions) on the average individual discharge peak current.

In turn, this deterministic behavioural relation is reflected in the plasma temperature which, aside from the electrolyte (which has already been exhaustively empirically selected) is ultimately what determines the temperature history of the oxide. Accordingly, the plasma temperature is thus the key to the control of the microstructure and the phase composition of the coatings. Control of the plasma temperature enables the process to achieve coatings with increased crystallinity and higher thermal conductivity. FIG. 9 illustrates the plasma temperature, for an aluminium PEO system on 2024 aluminium, as determined from an $OH^-$ molecular ion emission spectrum, controlled as a function of stepped voltage in an example of the present invention. The lower temperatures yield the highest proportion of alpha alumina.

Once the deterministic relations between process parameters and discharge characteristics (and in turn plasma conditions, thermal history, and resulting coating phase proportion) have been established for a given PEO system (i.e. combination of substrate alloy, electrolyte and applied potential), this knowledge may be used for future processing without the need for further experimentation or discharge parameter measurement. Any component of a given alloy may then be PEO processed so as to achieve optimal crystallinity simply by selecting the appropriate anodic pulse conditions. The relations are independent of the shape and size of any actual components (or even the electrical power supply used for processing): they depend only on the alloy and on the selected electrolyte. The choice of power supply for actual processing will only be important in so far as it must be able to deliver the selected voltage-time profile.

EXAMPLE 1

The Control Methodology as Applied to Aluminium 7075

An example of a control methodology that may thus be established for the processing of aluminium 7075 is given as follows.

A preferred embodiment of the power supply, as described earlier, is such that a substantially square wave anodic pulse of precisely 480±5V may be achieved within 4 µs.

Figure 8:
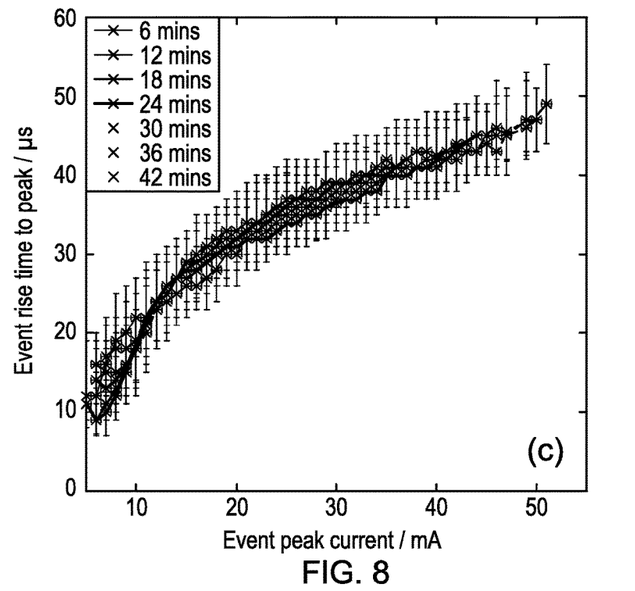
FIG. 8 shows an example of the dependence of discharge durations (as characterised by the time taken to reach peak current) on the average individual discharge peak current. The relation holds throughout processing, as indicated by the numerous overlying (and almost indistinguishable) traces for various different process times (see legend).

Since the intrinsic discharge duration distributions (FIG. 1) are such that the vast majority of discharges are still developing and expanding in this timescale (FIG. 8), this will ensure that the resulting discharges are near-simultaneous in their initiation and development, and will thus transfer the greatest current (and hence power) density to the plasma system. FIG. 8 illustrates typical event rise times for PEO processing of aluminium 7075

The selection of a 480V limit also ensures that they are constrained (as per FIGS. 7) to 12 mA peak power. This, in turn, results in less waste of electrical energy in plasma expansion and dissipation, and hence more intense injection of energy into the oxide coating. As a result, there is obtained the greatest degree of phase transformation from amorphous oxides (the product of conventional anodising) to crystalline oxides.

The duration of the resulting discharges is also intrinsically constrained (again, as per FIGS. 7) to ~50 µs. A further degree of control over this may in fact be achieved by restricting the applied anodic pulse durations to values equal to or less than this natural intrinsic duration. This may be achieved by using higher frequency pulses. For example, in this case, the anodic pulse may itself be limited to 50 µs.

Figure 10:
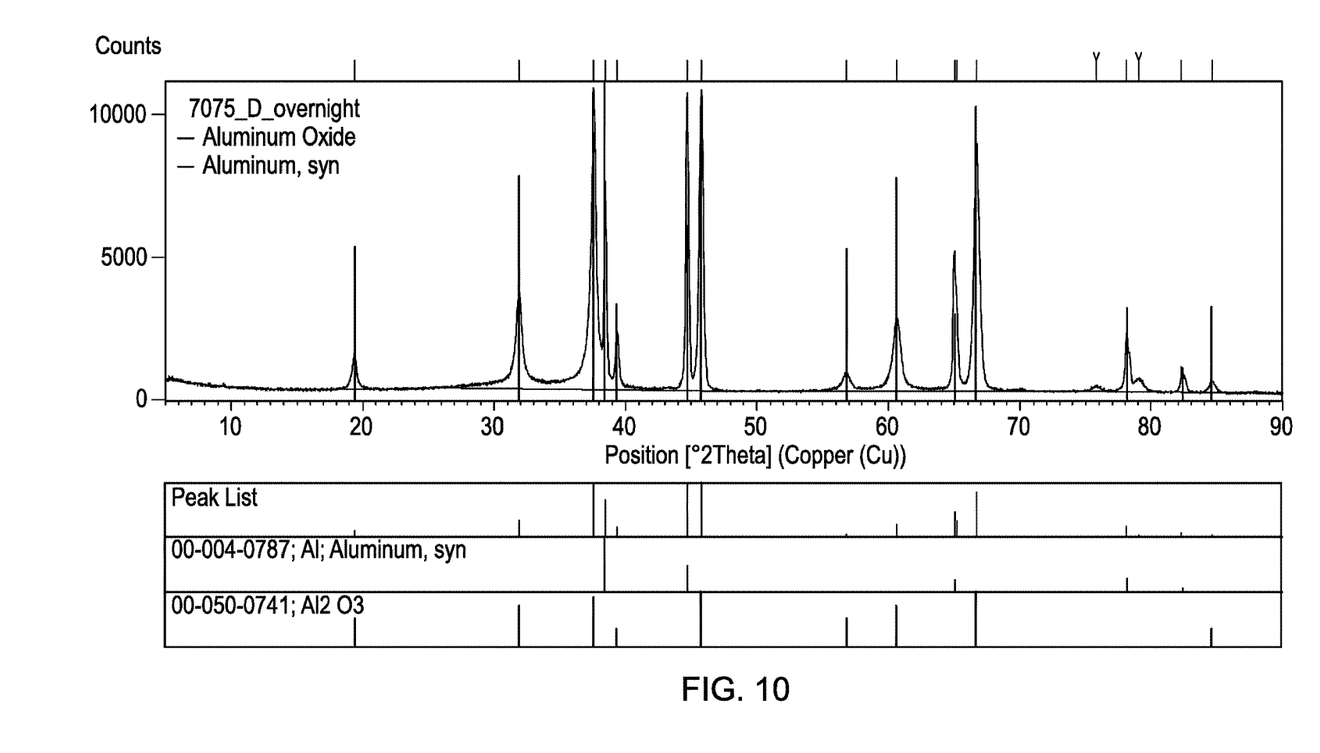
FIG. 10 shows an X-ray diffraction trace (measured from 5 to 90 degrees 2-theta in Bragg-Brentano geometry) for a coating grown on 7074 aluminium. The coating is 90% crystalline alumina, and the crystalline material is pure gamma alumina.

The result of all this optimisation is a coating that is 90% crystalline by volume—see FIG. 10. This is significantly higher than the previous state of the art (which is around 70-80% crystalline—"Porosity in plasma electrolytic oxide coatings", Curran, J. A. and Clyne, T. W., Acta Materialia, v. 54, pp. 1985-1993 (2006)).

The coating generated in this manner on aluminium 7075 is also a coating where the crystalline alumina consists purely of the cubic, "gamma" phase of alumina—which may itself be of interest in applications such as catalysis. The preferential formation of gamma alumina may be a result of the presence of a high proportion of zinc (5.1-6.1 wt %) or magnesium (2.1-2.9 wt %) in the substrate alloy (relative to a more typical 6XXX-series alloy on which a roughly equal mix of alpha and gamma phases tends to result).

Figure 12:
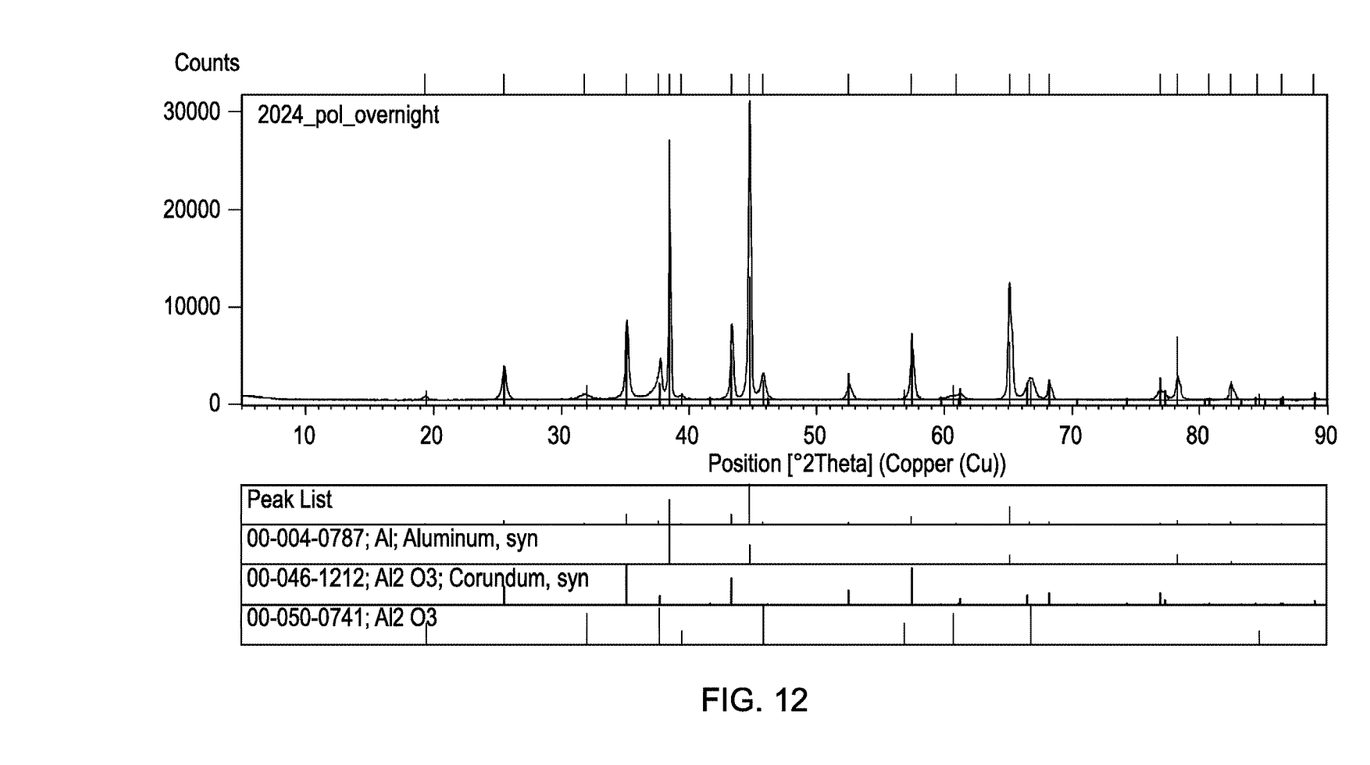
FIG. 12 shows an X-ray diffraction trace (measured from 5 to 90 degrees 2-theta in Bragg-Brentano geometry) for a coating grown on 2024 aluminium. The coating is 94% crystalline alumina, and is predominantly in the corundum phase.

The lower bound of the thermal conductivity of this coating, as measured in steady-state ["A steady-state bi-substrate technique for measurement of the thermal conductivity of ceramic coatings", Tan, J. C., Tsipas, S. A., Golosnoy, I. O., Curran, J. A., Paul, S. and Clyne, T. W., Surface and Coatings Technology, v. 201, no. 3-4, pp. 1414-1420 (2006)] was 4.8+/−0.2 $Wm^{-1}K^{-1}$ (FIG. 12).

This is at least twice as high as the thermal conductivity of known PEO coatings on aluminium ["The thermal conductivity of plasma electrolytic oxide coatings on aluminium and magnesium", Curran, J. A. and Clyne, T. W., Surface and Coatings Technology, v. 199(2-3), pp. 177-183 (2005)], and combined with ~2500 V breakdown resistance, this presents excellent potential as an insulated metal substrate.

EXAMPLE 2

Maximal Thermal Conductivity of 2024 Aluminium

In addition to the methodology disclosed above for the optimisation of crystallinity, it has been discovered that the presence of >2.5 wt % copper further stabilises the formation of alpha alumina in the PEO process, and 2XXX-series aluminium alloys thus present a particularly good substrate for the formation of insulated metal substrates.

2024 aluminium plates (3.8-4.9 wt % Cu) were processed in 12 g per liter ammonium hydroxide solution, with positive potentials selected at 500V and with 80 µs pulse duration, and negative pulses of 400V with 1000 µs duration. The positive pulse parameters were selected in accordance with the methodology described in Example 1, and based on a survey of discharge characteristics specific to that alloy and electrolyte system.

Figure 11:
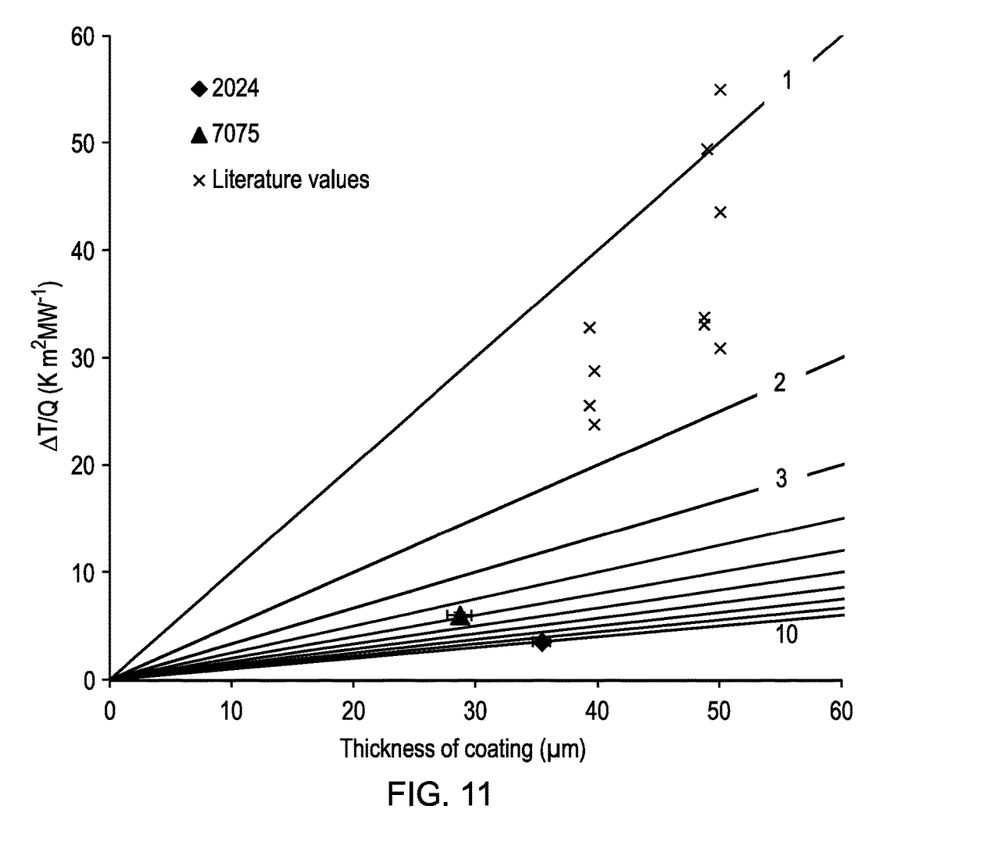
FIG. 11 shows thermal gradient data from the steady-state measurement of the thermal conductivity of the coating formed on 7075 aluminium (in Example 1) and 2024 aluminium (in Example 2), together with literature data for a typical coating on 6082 for comparison Guidelines correspond to thermal conductivities from 1 to 10 $Wm^{-1}K^{-1}$ respectively from top to bottom. [6082 reference data from "The thermal conductivity of plasma electrolytic oxide coatings on aluminium and magnesium", Curran, J. A. and Clyne, T. W., Surface and Coatings Technology, v. 199(2-3), pp. 177-183 (2005)].

The resulting ~30 µm coating grown in 20 minutes had 93% crystallinity by volume (FIG. 10), and more importantly still, consisted of 80% of the more thermally conductive corundum phase of alumina. The lower bound of the thermal conductivity, as measured in steady-state ["A steady-state bi-substrate technique for measurement of the thermal conductivity of ceramic coatings", Tan, J. C., Tsipas, S. A., Golosnoy, I. O., Curran, J. A., Paul, S. and Clyne, T. W., Surface and Coatings Technology, v. 201, no. 3-4, pp. 1414-1420 (2006)] was 10.0±1.2 $Wm^{-1}K^{-1}$ (FIG. 11).

This is approximately five times higher than the thermal conductivity of known PEO coatings on aluminium ["The thermal conductivity of plasma electrolytic oxide coatings on aluminium and magnesium", Curran, J. A. and Clyne, T. W., Surface and Coatings Technology, v. 199(2-3), pp. 177-183 (2005)], and combined with ~2500 V breakdown resistance, this presents excellent potential as an insulated metal substrate.

EXAMPLE 3

AZ31 Magnesium

Figure 13:
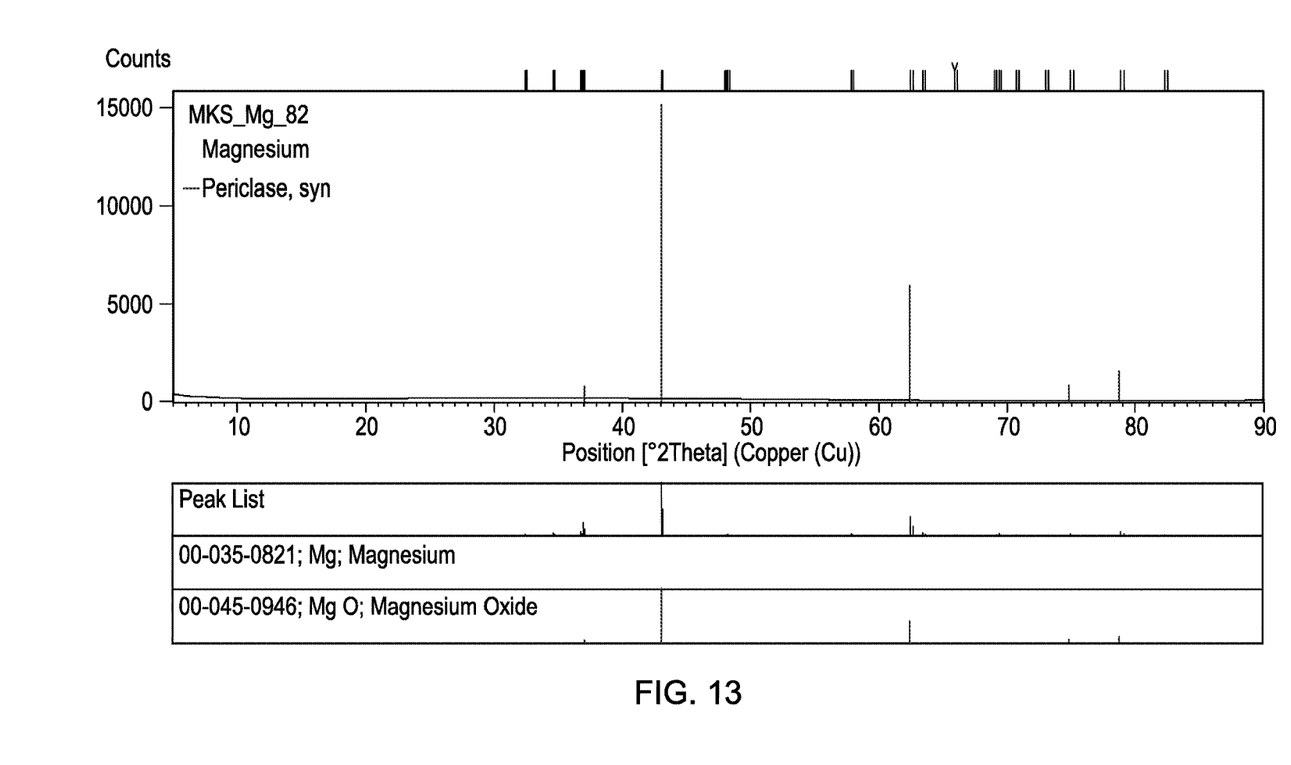
FIG. 13 shows an X-ray diffraction trace (measured from 5 to 90 degrees 2-theta in Bragg-Brentano geometry) for a coating formed on AZ31 magnesium. The coating is 94% crystalline in the periclase phase of MgO.

Applying the same methodology as described in Example 1 to data measured for AZ91 magnesium, processed in 0.02M sodium orthophosphate, parameters of 80 µs pulse duration and 480V are selected for the positive pulse. The ~25 µm thick coating resulting from 8 minutes of processing was 94% crystalline in the periclase phase of MgO—see FIG. 13. This is again a significant improvement over known PEO coatings on magnesium ["The thermal conductivity of plasma electrolytic oxide coatings on aluminium and magnesium", Curran, J. A. and Clyne, T. W., Surface and Coatings Technology, v. 199(2-3), pp. 177-183 (2005)].

The lower bound for the thermal conductivity, as measured in steady-state was 6±1 $Wm^{-1}K^{-1}$. The breakdown potential was ~1500V.

EXAMPLE 4

Ti6Al4V

Ti6Al4V was processed in 0.02M potassium hexametaphosphate, using positive pulses at a potential of 700V for 100 µs, interspersed with negative pulses of 200V with a 900 µs duration. In this case, substantially trapezoidal pulse shapes were used. The peakpositive potential was steadily reduced to 450V over the course of a seven minute process and the resulting ~10 µm coating had a breakdown strength of ~900V.

Figure 14:
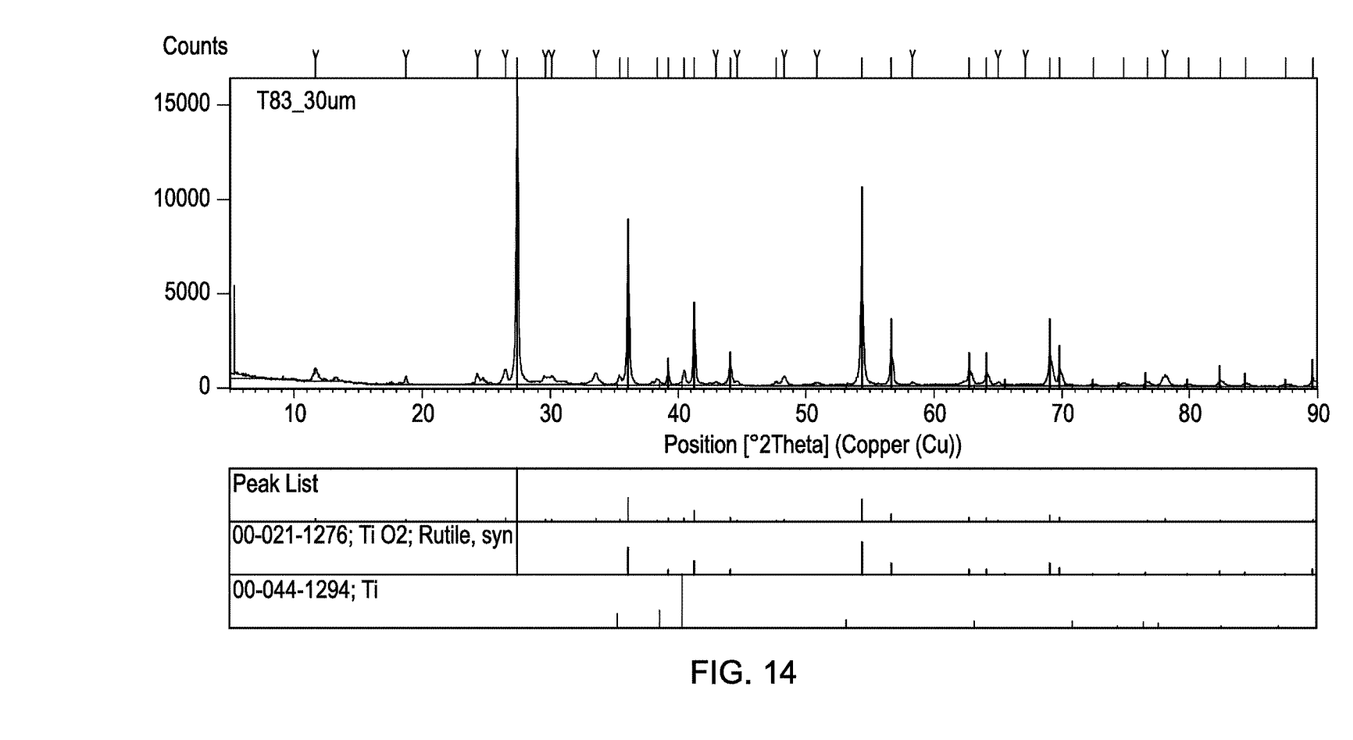
FIG. 14 shows an X-ray diffraction trace (measured from 5 to 90 degrees 2-theta in Bragg-Brentano geometry) for a coating formed on Ti6Al4V. The coating is 95% crystalline—predominantly rutile $TiO_2$.

The coating consisted of 95% crystalline by volume—predominantly in the rutile phase—see FIG. 14—and had an approximate thermal conductivity of 8±2 $Wm^{-1}K^{-1}$, as measured in steady-state.

EXAMPLE 5

A Flexible Insulated Metal Substrate

A 100 µm thick foil of aluminium 2024 was processed for 15 minutes in the manner disclosed in Example 2. The coating thickness was 20±3 µm, and the dielectric strength was measured as ~1750±150V.

The foil was subsequently formed around a nylon cylinder to a radius of 5 mm. The convex curved surface passed a number of dielectric proof tests at 1750V. The curved geometry did not allow for the same dielectric strength measure that had been used on the flat surface, i.e. measurement between the substrate and a 10 mm diameter brass cylinder's flat end.

The foil was then flattened and the dielectric strength measured again using the same test method used prior to the forming operation. The dielectric strength on both faces of the foil were shown to exhibit the same dielectric strength as they did prior to forming: ~1750+/−150V.

EXAMPLE 6

Heat and Thermal Shock Resistance Insulated Metal Substrate

Further samples of the foil described in Example 5 were subjected to thermal tests. One was placed in a furnace at 330° C. for 24 hours. After cooling to room temperature, it dielectric strength was measured as 1725V (i.e. no different from its value prior to this temperature exposure).

Further samples were subjected to repeated cycles of thermal shock: alternately immersed in boiling liquid nitrogen and in boiling water. After 100 cycles, there was no appreciable damage to the surface, and the dielectric strength was un-changed.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A method of monitoring electrical characteristics of individual discharges within a plasma electrolytic oxidation process undertaken on a metallic workpiece, the plasma electrolytic oxidation process comprising the application of a series of current pulses to the workpiece while the workpiece is immersed in an electrolyte, by exposing at least one small area of a test piece made of the same material as the workpiece to the electrolyte under various voltages within a range of interest, such that individual discharges are separately resolvable in a continuously monitored flow of current to the small area over the course of the series of current pulses so as to measure the dependence of current-time profiles of the individual discharges on an applied voltage, wherein the small area consists of at least one wire contained within a threaded, electrically insulative insert configured to be screwed into a threaded hole in the workpiece such that the wire is exposed to the electrolyte in electrical parallel with the larger area of the workpiece, but electrically isolated from the workpiece in such a way that the current flow between the two may be monitored.

2. The method according to claim 1, wherein the isolated wire is embedded within the surface of the workpiece.

3. The method according to claim 1, wherein the small area is less than 0.5 $mm^2$.

4. The method according to claim 1, wherein an electrically insulating polymer surrounds the wire.

5. The method according to claim 1, wherein the wire is exposed at its end to the specific local conditions of part of the surface of the workpiece when the insert is screwed into the threaded hole.

* * * * *